United States Patent [19]

Tsukakoshi et al.

[11] Patent Number: 5,337,318
[45] Date of Patent: Aug. 9, 1994

[54] MEMORY IC TESTING APPARATUS WITH REDUNDANCY CIRCUIT

[75] Inventors: Hisao Tsukakoshi, Yokohama; Hisatoshi Shirasaka, Tokyo, both of Japan

[73] Assignee: Kabushiki Kaisha Toshiba, Kawasaki, Japan

[21] Appl. No.: 762,107

[22] Filed: Sep. 19, 1991

[30] Foreign Application Priority Data

Sep. 20, 1990 [JP] Japan .................................. 2-251548

[51] Int. Cl.$^5$ .............................................. G06F 11/00
[52] U.S. Cl. ........................................ 371/5.5; 371/5.1
[58] Field of Search ............... 371/5.5, 5.1, 8.1, 7, 371/21.1, 40.1, 27, 10.1; 365/201

[56] References Cited

U.S. PATENT DOCUMENTS

| 4,339,657 | 7/1982 | Larson et al. | 235/92 QC |
| 4,414,665 | 11/1983 | Kimura et al. | 371/21 |
| 5,224,101 | 6/1993 | Popyack, Jr. | 371/21.1 |

FOREIGN PATENT DOCUMENTS 61-41080  9/1986  Japan .

*Primary Examiner*—Robert W. Beausoliel, Jr.
*Assistant Examiner*—Phung My Chung
*Attorney, Agent, or Firm*—Finnegan, Henderson, Farabow, Garrett & Dunner

[57] ABSTRACT

A testing apparatus for a memory IC with a redundancy circuit includes a first memory, a counter, a second memory and a comparator. The first memory has a memory area for row addresses or column addresses of a target memory with a redundancy circuit, and stores row addresses or column addresses of defective bits of the target memory. The counter counts the number of defective-bit containing rows or columns of the target memory. The second memory stores a number of rows or columns of spare memory cells provided in the redundancy circuit. The comparator compares a count value of the counter with the number stored in the second memory. When the count value of the counter exceeds the number of rows or columns of spare memory cells stored in the second memory, it is considered unrepairable and test is terminated. When the former value does not exceed the latter, memory cells in a defective-bit containing row or column in the target memory are replaced with memory cells in an associated row or column in the redundancy circuit based on the row addresses or column addresses stored in the first memory.

14 Claims, 4 Drawing Sheets

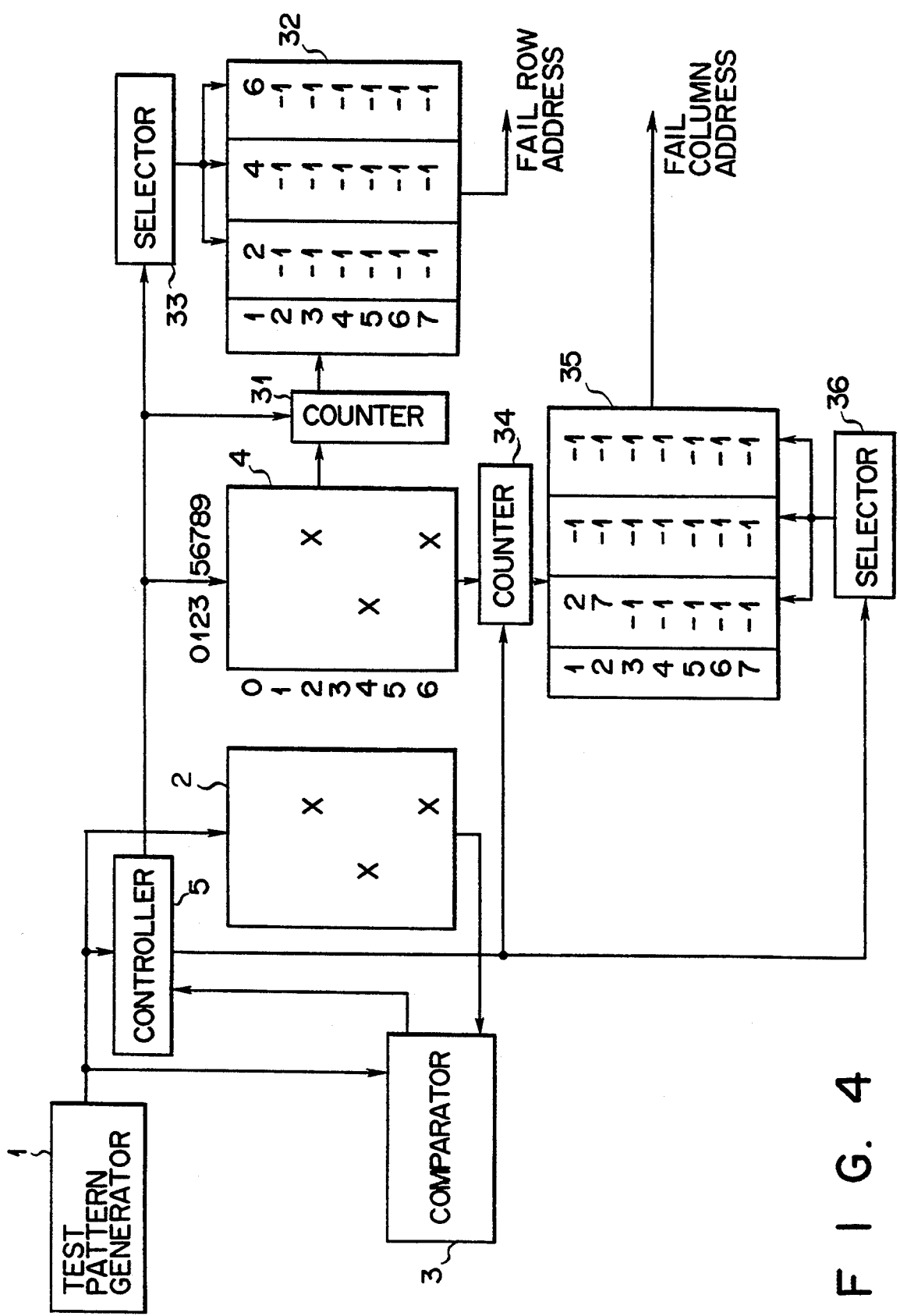
F I G. 4

MEMORY IC TESTING APPARATUS WITH REDUNDANCY CIRCUIT

BACKGROUND OF THE INVENTION

1. Field of the Invention

The present invention relates to a testing apparatus for a memory IC with a redundancy circuit.

2. Description of the Related Art

Conventional testing apparatuses for a memory IC with a redundancy circuit basically have a structure as shown in FIG. 1. This type of a testing apparatus is disclosed in, for example, Published Examined Japanese Patent Application No. 61-41080. The testing apparatus in FIG. 1 comprises a pattern generator 1 for generating a test pattern, a comparator 3, an address fail memory 4, and a controller 5. An address signal and data output from the pattern generator 1 are supplied to a target memory (memory under test) 2 and data is written at the associated address there. The comparator 3 compares data read out from the target memory 2 with data for the associated address output from the pattern generator 1 to check whether the written data is identical to the read data. The comparison output of the comparator 3 and the address signal from the pattern generator 1 are supplied to the controller 5. Defective information (or failure information) of the target memory 2 is written in the address fail memory 4 under the control of the controller 5. When there exists a defective bit (or failure bit) in the target memory 2, the address fail memory 4, having the same memory space as the target memory 2, is enabled to write the defect information at the associated address.

When a test for all the addresses of the target memory 2 is completed, data stored in the address fail memory 4 is sequentially searched and is read out bit by bit to check the number of defective bits and the associated fail addresses. Based on this defect information, it is determined by means of software whether or not a defect in the target memory 2 can be repaired by the redundancy circuit. If the repairing is possible, memory cells in the row or column where the defect has occurred are replaced with those in the corresponding row or column in the redundancy circuit. When the number of rows or columns where defective bits have occurred is greater than the number of rows or columns of the spare memory cells of the redundancy circuit, it is determined unrepairable.

As described above, the conventional testing apparatuses temporarily fetch defect information, detected during test, into the address fail memory 4, read out data therefrom bit by bit to acquire the number of defective bits and the associated addresses after the test is completed, and determine whether the defective bits can be repaired based on the defect information. It is therefore necessary to search all the addresses in the address fail memory 4 for failed data. The speed for this processing is determined by the processing speed of the hardware of the address fail memory 4. As it is software that determines whether defects can be repaired based on the read-out defect information, the speed for the discrimination processing is determined by the performance of a CPU in use.

Accordingly, the testing performance depends not only on the performance of the hardware of the failure analysis memory (address fail memory), but also on the performance of the CPU, the interrupt processing to the CPU, how to program the CPU, etc., thus making it difficult to improve the processing speed. Particularly, the recent increase in the capacity of target memories considerably reduces processing efficiency to determine whether defective memory cells can be repaired. When many target memories are tested simultaneously to improve the testing efficiency, it is necessary to at last determine whether defective memory cells are repairable for each device, inevitably reducing the multiple-testing originated effects.

SUMMARY OF THE INVENTION

It is therefore an object of the present invention to provide a testing apparatus for a memory IC with a redundancy circuit that can shorten a test time.

To achieve this object, according to one aspect of the present invention, there is provided a testing apparatus for a memory IC with a redundancy circuit, including a first memory having a memory area for row addresses or column addresses of a target memory with a redundancy circuit, for storing row addresses or column addresses of defective bits of the target memory; a counter for counting a number of defective-bit containing rows or columns of the target memory; a second memory for storing a number of rows or columns of spare memory cells provided in the redundancy circuit; and a comparator for comparing a count value of the counter with a number stored in the second memory, wherein when the count value of the counter exceeds the number of rows or columns of spare memory cells stored in the second memory, it is considered as unrepairable and test is terminated, and when the former value does not exceed the latter, memory cells in a defective-bit containing row or column in the target memory are replaced with memory cells in an associated row or column in the redundancy circuit based on the row addresses or column addresses stored in the first memory.

With this structure, in the case where the target memory has a row of spare memory cells or a column of spare memory cells, when it is detected that the number of defective-bit containing rows or columns counted by the counter exceeds a repairable number, it is judged unrepairable and the test can be terminated unfinished. This can eliminate the need to conduct a wasteful test on the target memory containing many defective bits, and can thus improve the processing efficiency to shorten the test time. The first memory does not require the same memory capacity as the target memory, but simply needs a memory area for row addresses or column addresses of the target memory, thus realizing cost reduction and space reduction of the testing apparatus.

According to another aspect of this invention, there is provided a testing apparatus for a memory IC with a redundancy circuit, including a first memory having a memory area for row addresses of a target memory with a redundancy circuit, for storing row addresses of defective bits of the target memory; a second memory having a memory area for column addresses of the target memory, for storing column addresses of defective bits of the target memory; a first counter for counting a number of defective-bit containing rows of the target memory; a second counter for counting a number of defective-bit containing columns of the target memory; a third memory for storing a number of rows of spare memory cells provided in the redundancy circuit; a fourth memory for storing a number of columns of spare memory cells provided in the redundancy circuit;

a first comparator for comparing a count value of the first counter with a number stored in the third memory; a second comparator for comparing a count value of the second counter with a number stored in the fourth memory; and a logical product circuit for acquiring a logical product of comparison outputs of the first and second comparators and outputting a repair enable signal representing a repairable state, wherein when the repair enable signal is not output from the logical product circuit, test is terminated, and when the repair enable signal is not output, memory cells in at least one of a defective-bit containing row and a defective-bit containing column in the target memory are replaced with memory cells in at least one of an associated row and an associated column in the redundancy circuit based on the row addresses of defective bits stored in the first memory and the column addresses of defective bits stored in the second memory.

With this structure, in the case where the target memory has a row of spare memory cells and a column of spare memory cells, when it is not detected by the repair enable signal from the logical product circuit that the number of defective-bit containing rows and the number of defective-bit containing columns exceeds unrepairable numbers, it is judged repairable, making it unnecessary to execute a defective-bit search subroutine. This can eliminate the need to conduct a wasteful test on the target memory containing fewer repairable defective bits, and can thus improve the processing efficiency to shorten the test time. The first and second memories do not require the same memory capacity as the target memory, but simply need a memory area for row addresses of the target memory and a memory area for column addresses, respectively, thus realizing cost reduction and space reduction of the testing apparatus.

According to a different aspect of this invention, there is provided a testing apparatus for a memory IC with a redundancy circuit, including a first memory for address failure, having at least a same memory area as a target memory, for storing defect information; a first counter for counting a number of defective-bit rows based on the defect information stored in the first memory; a second counter for counting a number of defective-bit columns based on the defect information stored in the first memory; a second memory for storing row addresses of defective bits of the target memory, with a number of defective bits present in the same row being taken as an address; and a third memory for storing column addresses of defective bits of the target memory, with a number of defective bits present in the same column being taken as an address, wherein memory cells in at least one of a defective-bit containing row and a defective-bit containing column in the target memory are replaced with memory cells in at least one of an associated row and an associated column in the redundancy circuit based on the row addresses of defective bits stored in the second memory and the column addresses of defective bits stored in the third memory.

With the above structure, when the target memory has a row of spare memory cells and a column of spare memory cells, it is possible to repair defective bits starting with the address having the largest number of defects by permitting the first and second counters to respectively count the number of fail row addresses and fail column addresses and sequentially reading the fail row addresses and fail column addresses respectively from the second and third memories. This design feature permits high-speed processing by the maximum-defect repairing system (which repairs defects starting with the row or column address having the largest number of defects) with a simple program. The processing efficiency will not be reduced even when many target memories are simultaneously tested.

According to a further aspect of this invention, there is provided a testing apparatus for a memory IC with a redundancy circuit, including a first testing section and a second testing section, the first testing section including, a first memory having a memory area for row addresses of a target memory with a redundancy circuit, for storing row addresses of defective bits of the target memory, a second memory having a memory area for column addresses of the target memory, for storing column addresses of defective bits of the target memory, a first counter for counting a number of defective-bit containing rows of the target memory, a second counter for counting a number of defective-bit containing columns of the target memory, a third memory for storing a number of rows of spare memory cells provided in the redundancy circuit, a fourth memory for storing a number of columns of spare memory cells provided in the redundancy circuit, a first comparator for comparing a count value of the first counter with a number stored in the third memory, a second comparator for comparing a count value of the second counter with a number stored in the fourth memory, and a logical product circuit for acquiring a logical product of comparison outputs of the first and second comparator and outputting a repair enable signal representing a repairable state, the second testing section including, a fifth memory for address failure, having at least a same memory area as the target memory, for storing defect information, a third counter for counting a number of defective-bit rows based on the defect information stored in the fifth memory, a fourth counter for counting a number of defective-bit columns based on the defect information stored in the fifth memory, a sixth memory for storing row addresses of defective bits of the target memory, with a number of defective bits present in the same row being taken as an address, and a seventh memory for storing column addresses of defective bits of the target memory, with a number of defective bits present in the same column being taken as an address, wherein when the repair enable signal is output from the logical product circuit in the first testing section and memory cells in a defective-bit containing row or a defective-bit containing column in the target memory can be replaced with spare memory cells in an associated row or an associated column in the redundancy circuit, memory cells in the defective-bit containing row or column in the target memory are replaced with memory cells in the associated row or associated column in the redundancy circuit, based on the row addresses of defective bits stored in the first memory and the column addresses of defective bits stored in the second memory, and when memory cells both in a defective-bit containing row and a defective-bit containing column in the target memory can be replaced with spare memory cells in an associated row and an associated column in the redundancy circuit, the former memory cells in the target memory are replaced with the latter spare memory cells in the redundancy circuit, based on the row addresses of defective bits stored in the sixth memory and the column addresses of defective bits stored in the seventh memory in the second testing section.

With the above structure, the test is divided into two stages, respectively conducted by the first testing section and the second testing section, so that the optimal judgment can be made in accordance with how defects have occurred, thus ensuring high-speed processing to shorten the test time. In other words, during testing, the first testing section is used to determine whether defective memory cells can be repaired using only one of a row and a column or cannot be repaired even using both the row and column, and when memory cell repairing is possible by both the row and column but cannot be effected using only one of them, the second testing section is used to spare memory cells starting with the address containing many defective bits. Accordingly, when there are few defective bits and memory cell repairing can be effected using only one of a row and a column, or when there are many defective bits and memory cell repairing is not possible even using both the row and column, the first testing section is used to efficiently repair the memory cells containing the defective bits in real time. When memory cell repairing is not possible using either the row or column alone, the second testing section is used to efficiently conduct the repairing job based on the maximum-defect repairing system.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 3 is a schematic block diagram illustrating the structure of a testing apparatus for a memory IC with a redundancy circuit according to the second embodiment of the present invention and FIG. 4 is a schematic block diagram illustrating the structure of a testing apparatus for a memory IC with a redundancy circuit according to the third embodiment of the present invention.

DETAILED DESCRIPTION OF THE PREFERRED EMBODIMENTS

Figure 2:
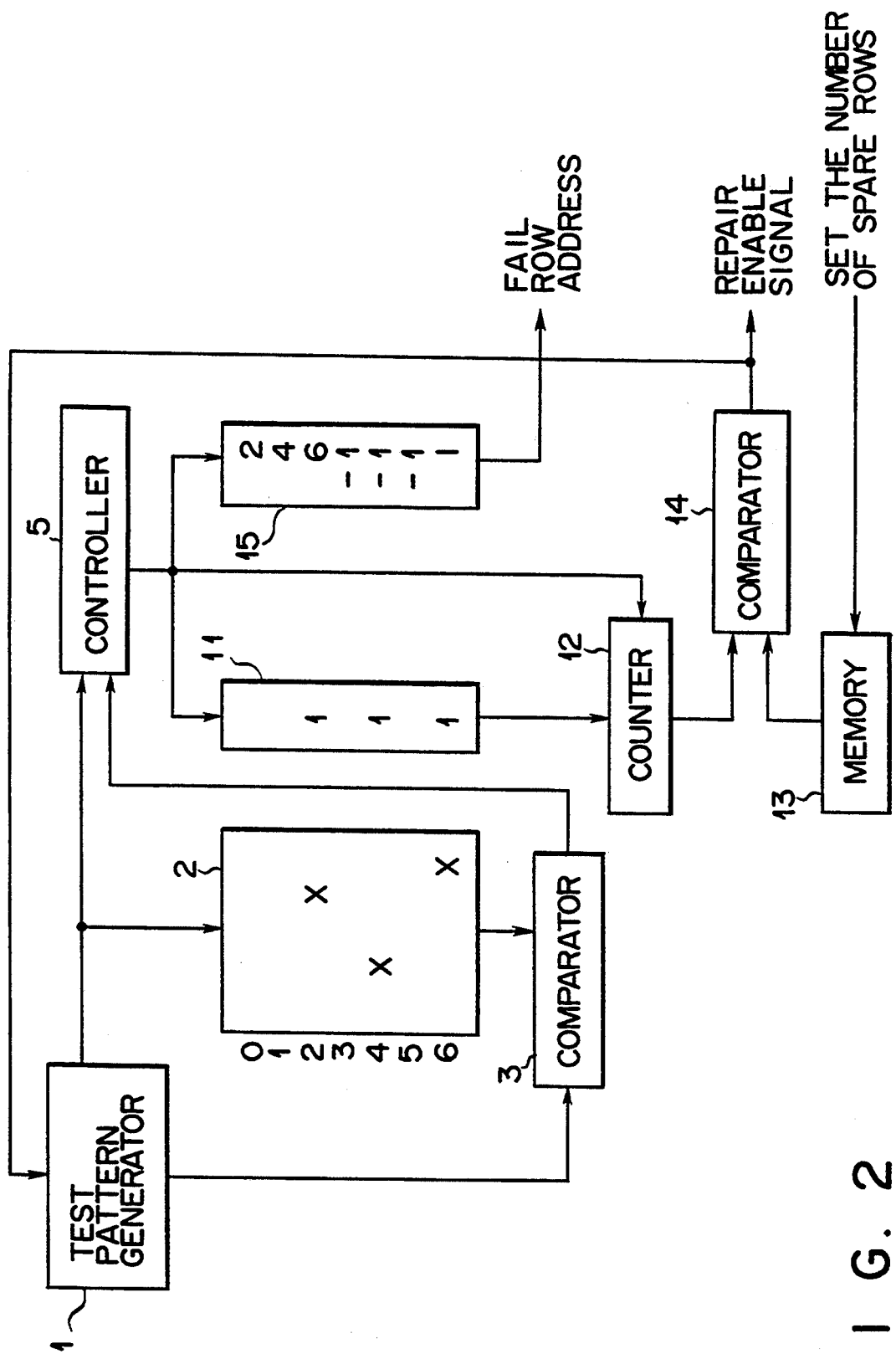
FIG. 2 is a schematic block diagram illustrating the structure of a testing apparatus for a memory IC with a redundancy circuit according to the first embodiment of the present invention.

FIG. 2 illustrates the schematic structure of a testing apparatus for a memory IC with a redundancy circuit according to the first embodiment of the present invention. This arrangement is adequate for a target memory with a redundancy circuit corresponding to row addresses.

An address signal and data output from the pattern generator 1 which generates a test pattern are supplied to a target memory (memory under test) 2 and data is written at the associated address there. The comparator 3 receives data read out from the target memory 2 with data (reference data) output from the pattern generator 1 for comparison. The comparison output of the comparator 3 and the address signal from the pattern generator 1 are supplied to a controller 5. If the data read out from the target memory 2 and the data output from the pattern generator 1 differ from each other, data indicating the presence of a defective bit (or failure bit) is written piece by piece at an address in a line memory 11 associated with the row address of the target memory 2 under the control of the controller 5. Suppose that there exist defective bits marked by "X" at row addresses "2,", "4" and "6" in the target memory 2 as shown in FIG. 2. Each time the comparator 3 detects noncoincidence in data, data "1" is written at the associated address in the line memory 11. At the same time, fail row addresses "2," "4" and "6" are written one by one in a defective address memory (line memory) 15 under the control of the controller 5. Data "−1" in the defective address memory 15 indicates that the fail row address is not yet written in the memory 15. When defect information (or failure information) is to be written in the line memory 11, the controller 5 permits a counter 12 to count up its count value upon each detection of a defective bit. The number of rows of spare memory cells is previously determined in a spare number setting memory 13. Data stored in this memory 13 and the count value of the counter 12 are supplied to a comparator 14 for comparison. It is determined by the comparison output from the comparator 14 whether or not an occurred defect can be repaired. The count value of the counter 12 is incremented each time a defective bit is written into the line memory 11. Since the defective bit cannot be repaired when the count value exceeds a value set in the spare number setting memory 13, the comparator 14 supplies a repair disable signal to the pattern generator 1 to stop its operation. The repairing is still possible, however, if the number of fail rows is equal to or lower than the set value in the memory 13 even after the testing for all addresses in the target memory 2 is completed. A fail address is read out from the defective address memory 15, and memory cells which are connected to the fail rows in the target memory 2 are replaced with those in the redundancy circuit.

The operation of the testing apparatus with the above-described arrangement will now be explained. When the test is conducted, data is written into and read from the target memory 2. If there exist defective bits in the target memory 2 as marked by "X", "1" is written at the associated address in the line memory 11. The counter 12 counts up its value every time a defect is detected, and the comparator 14 compares the count value with the set value in the spare number setting memory 13. When the count value becomes larger than the set value, a repair disable signal is output to disable the operation of the pattern generator 1, thereby interrupting the test. If the repair disable signal is not output from the comparator 14 even after the test is completed for all the addresses in the target memory 2, it is determined that the repairing is possible, and a fail row address is read out from the defective address memory 15. The memory cells in the row or column where the defect has occurred are replaced with those in the associated row or column in the redundancy circuit.

With the above structure, when it is detected that the value of the counter 12 is above the set number the repairing is possible by the redundancy circuit. Since a test does not need to be conducted on the target memory that contains many defective bits which cannot be repaired, the processing efficiency can be improved to increase the processing speed. This arrangement is particularly effective for devices which have a target memory 2 with a large storage capacity and requires a long testing period. Further, as a failed row address can be read out directly from the defective address memory 15, it is not necessary to read data bit by bit from an address fail memory having the same memory space as the target memory 2. High speed accessing is therefore possible. Furthermore, since the line memory 11 and the defective address memory 15 do not require a storage capacity equal to that of the target memory 2, it is possible to ensure the cost reduction and minimal space of the testing apparatus.

While the first embodiment has been explained with reference to the case where the target memory 2 has a redundancy circuit associated with a row address, basically, there may be a case in which the target memory 2 has a redundancy circuit associated with a column address.

Figure 1:
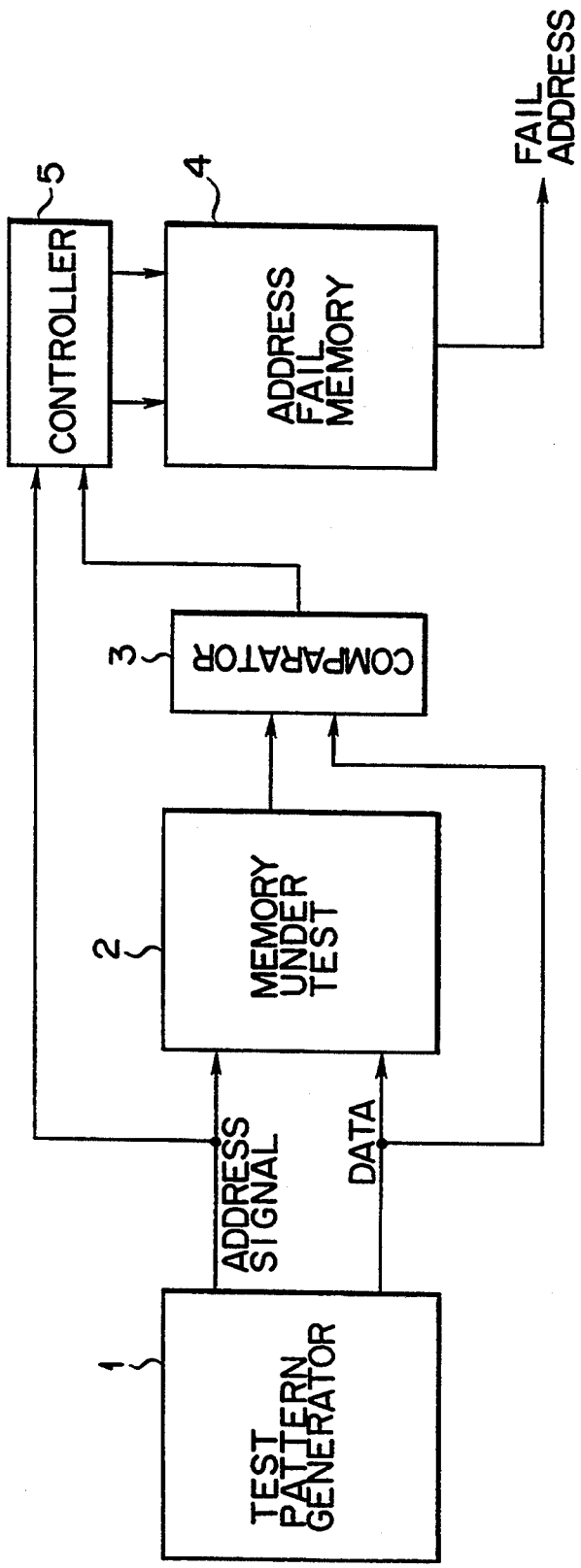
FIG. 1 is a schematic block diagram illustrating the structure of a conventional testing apparatus for a memory with a redundancy circuit.

The testing apparatus with the structure shown in FIG. 2 is particularly effective when used in a test for an EPROM which takes time to write data and usually writes data in memory cells multiple times. Since many defects might occur immediately after each product is activated, the application of the present invention will provide good results. If the testing apparatus shown in FIG. 1 searches a 4-M bit area at an accessing speed of 20-MHz, the searching takes about 210 ms per device, and the test time takes about 100 sec (10 $\mu s \times 20$ times$\times 4M/8$ bits$=105$ sec). With the use of the testing apparatus shown in FIG. 2 which stops its operation when needed during the test, however, the test time can be shortened down to about 0.2 sec (10 $\mu s \times 20$ times$\times 512$ row$\times 2=0.2$ sec).

If the test for the target memory 2 is masked using the data stored in the line memories 11 and 15 as mask data, the arrangement in FIG. 2 is also effective for devices which have a long test period, or devices which take time to write data and require data writing multiple times.

Figure 3:
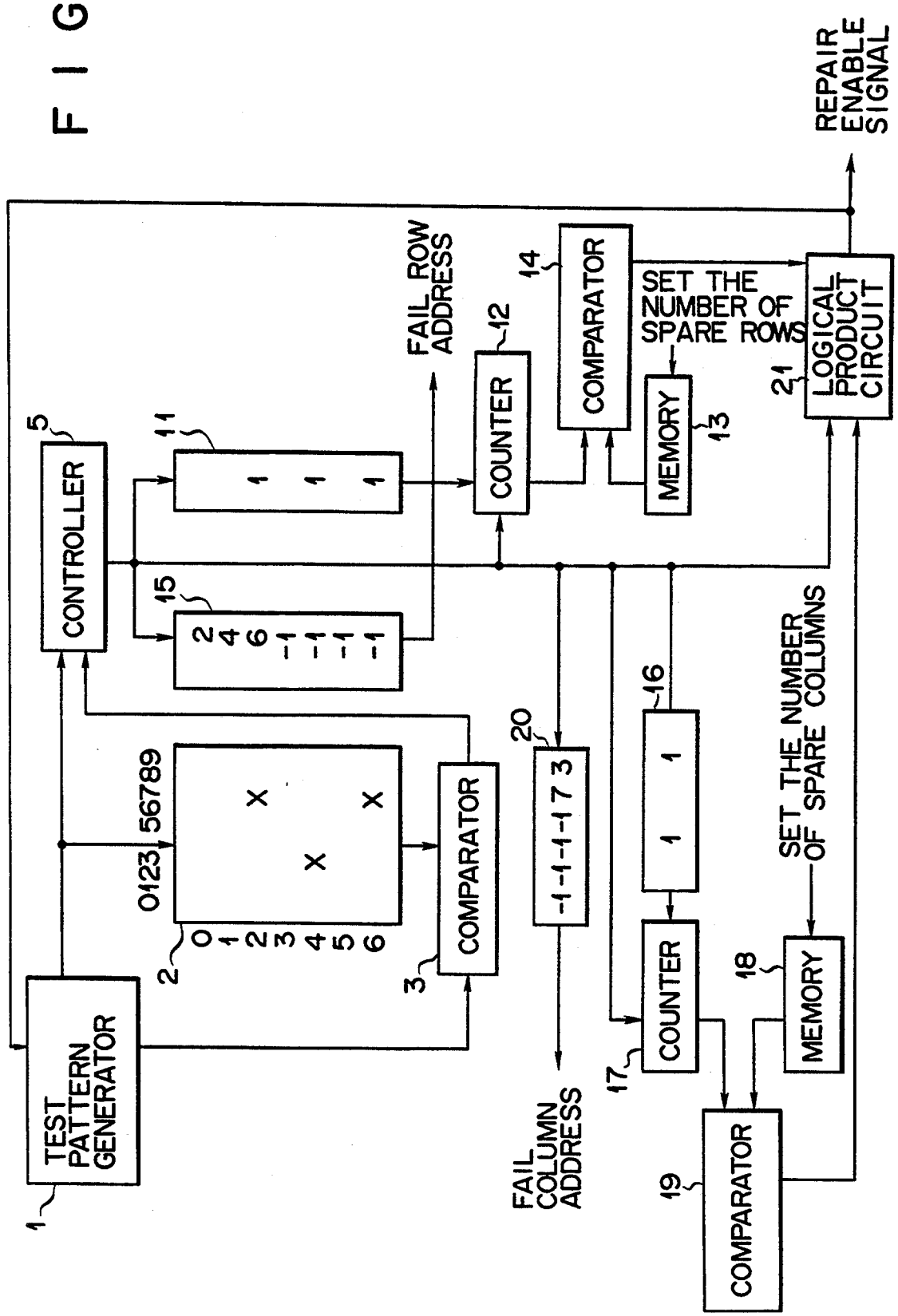

FIG. 3 is a schematic block diagram illustrating the structure of a testing apparatus for a memory IC with a redundancy circuit according to the second embodiment of the present invention. This arrangement is suitable for a target memory with a redundancy circuit corresponding to row and column addresses. The same reference numerals are used to specify those components in FIG. 3 corresponding or identical to the components in FIG. 2 to avoid their redundant description.

In addition to the arrangement in FIG. 2, the testing apparatus in this embodiment comprises a second line memory 16, a second counter 17, a second spare number setting memory 18, a second comparator 19, a second defective address memory 20 and a logical product circuit 21. Data indicating the presence of a defective bit is written piece by piece at an address in the second line memory 16 associated with the column address of the target memory 2 under the control of the controller 5.

Suppose that there exist defective bits marked by "X" at column addresses "3" and "7" in the target memory 2 as shown in FIG. 3. Data "1" is written at the associated address in the line memory 16. At the same time, fail column addresses "3" and "7" are written one by one in the defective address memory 20 under the control of the controller 5. Data "$-1$" in the defective address memory 20 indicates that the fail column address is not yet written in the memory 20. The counter 17 counts up its count value upon each detection of a fail column. The number of columns of spare memory cells in the redundancy circuit is previously stored in a spare number setting memory 18. The value stored in this memory 18 and the count value of the counter 17 are supplied to a comparator 19 for comparison. The comparisons generated from the comparator 19 and the comparator 14 are supplied to the logical product circuit 21 to acquire their product. It is determined therefore whether or not the defect can be repaired.

The operation in the above-structured circuit is the same as that in the circuit shown in FIG. 2 until the comparator 3 compares data read out from the target memory 2 with data sent from the pattern generator 1. When a defective bit is detected, "1" is written at an address associated with a failed row in the line memory 11 and also at an address associated with a failed column in the line memory 16. At the same time, the address in the failed row and the address in the failed column are respectively written in the defective address memories 15 and 20. The counter values of the counters 12 and 17 are counted up upon each writing in the respective line memories 11 and 16, and are compared with the set values in the spare number setting memories 13 and 18 by the comparators, respectively. If either number of failed rows or failed columns is equal to or below the set values of the memories 13 and 18 even after the address test is all completed, repair is still possible. The address of the failed row and the address of the failed column are therefore read out from the defective address memories 15 and 20, respectively, and memory cells in the failed row address and failed column address are replaced with memory cells in the associated spare row and associated spare column in the redundancy circuit.

With the above arrangement, the test can be conducted at a high speed when the target memory has a redundancy circuit associated with the row and column addresses.

FIG. 4 is a schematic block diagram showing the structure of a testing apparatus for a memory IC with a redundancy circuit according to the third embodiment of the present invention. This testing apparatus can improve efficiency in defect repairing when a target memory has a redundancy circuit associated with row and column addresses. An address signal and data output from the pattern generator 1 are supplied to the target memory 2, and data is written at the associated address. Data read out from the target memory 2 and the data (reference data) output from the pattern generator 1 are supplied to the comparator 3 for comparison. The comparison output from the comparator 3 and the address signal from the pattern generator 1 are sent to the controller 5. If the data read from the target memory 2 is different from the data output from the pattern generator 1, data (marked by "X") indicating the presence of a defective bit is written at an address in the address fail memory 4, which is associated with the address in the target memory 2. The number of fail row addresses written in the address fail memory 4 is counted by a defective bit counter 31, while the fail row address is written in a defective address memory 32. At this time, the fail row address is written as data in the defective address memory 32 with the number of defects being taken as an address (index) under the control of a selector 33. The number of fail column addresses written in the address fail memory 4 is counted by a defective bit counter 34, and the fail column address is written in a defective address memory 35. The fail column address is written as data in the defective address memory 35 with the number of defects being taken as an address (index) under the control of a selector 36. The defective bit counters 31 and 34, and the selectors 33 and 36 are controlled by an output signal of the controller 5, so that a fail row address and a fail column address are acquired from the defective address memory 32 and the defective address memory 35, respectively.

With the above-described structure, when a defect is detected in the target memory 2 in the test, defective information is fetched at the associated address in the address fail memory 4. The number of defects in rows and columns in the address fail memory 4 are counted by the respective defective bit counters 31 and 34 after the test is over. In fetching the defective information, the fail row address or fail column address is written as data with the number of defects being taken as an address. The failed address for each number of defects are stored in the defective address memories 32 and 35 in the order of the defective address having a greater number of defects to the address having a smaller number. Searching for the failed addresses in the defective address memories 32 and 35 may start with the addresses having the most defects, and the repairing process may be carried out on the defective bits whose addresses have already been written.

With this arrangement, it is unnecessary to find out the maximum number of defects and search for the address for that time. This can eliminate the need for an algorithm to sort the address in the order of a greater number of defects to smaller one again, releasing the load of the software by about 40%. In addition, the processing speed can be increased by the time corresponding to the otherwise required re-sorting, i.e., by about 60%.

The combination (fourth embodiment) of the testing apparatus shown in FIG. 4 and the one in FIG. 3 can further improve the processing efficiency. According to the fourth embodiment, during a test, defective information of the target memory 2 are fetched or read into the line memories 11 and 16 and the defective address memories 15 and 20 are fetched into the address fail memory 4, as well. The defective information fetched in the line memories 11 and 16 are counted up for each row and column by the counters 12 and 17 to check how many lines have failed. The comparator 14 compares the set value in the spare number setting memory 13 with the number of failed lines counted by the counter 12. Likewise, the comparator 19 compares the set value in the spare number setting memory 18 with the number of failed lines counted by the counter 17. The logical product circuit 21 acquires a logical product of the comparison outputs of both comparators 14 and 19. And, soon after the test it would be detected from the repair enable signal from the logical product circuit 21 that the number of failed rows and the number of failed columns do not exceed the level repairable by the redundancy circuit, making it unnecessary to execute the defective search subroutine. It is therefore unnecessary to carry out a wasteful test on a target memory having fewer repairable defective bits. When defective bits can be repaired using only one of a row and a column, the memory cells in the failed row or failed column are replaced with the spare memory cells in the associated row or column in the redundancy circuit based on the fail row address stored in the defective address memory 15 or the fail column address stored in the defective address memory 20. When memory cell repair is possible but cannot be done using either the row or column alone, after all defective information are written in the address fail memory 4, the numbers of defects associated with the row address and the column address are counted up by the counters 31 and 34, respectively. The fail row addresses and fail column addresses are sequentially read out from the defective address memories 32 and 35, respectively, to thereby permit defects to be saved starting with the row or column address having the largest number of failures. The search for the failed address starts with the addresses having a greater number of failures and the repair starts with those defective bits whose addresses have already been written.

With the above structure, the test is divided into two stages respectively conducted by the circuit section shown in FIG. 3 and the circuit section shown in FIG. 4, so that the optimal judgment can be made in accordance with how defects have occurred. During testing, the circuit section in FIG. 3 is used to determine whether defective memory cells can be repaired using only one of a row and a column or cannot be repaired even using both the row and column, and when memory cell repairing is possible using both the row and column but cannot be achieved using only one of them, the circuit section in FIG. 4 is used to spare memory cells starting with the address containing many defects. Accordingly, when there are few defective bits and memory cell repair can be achieved using only one of a row and a column, or when there are many defective bits and memory cell repair is not possible when using both the row and column, the circuit section in FIG. 3 is used to efficiently repair the memory cell addresses containing the defective bits in real time. When memory cell repair is not possible using either the row or column alone, the circuit section in FIG. 4 is used to efficiently conduct the repairing job based on the maximum-defect repairing system. The testing apparatus according to the fourth embodiment is very effective for stable products (having fewer defects) in the mass-production stage.

According to the fourth embodiment, the test on the target memory 2 can of course be masked using the data in the line memories as mask data, as per the first and second embodiments. This modification can allow efficient testing of a target memory which has a long test period, or which takes time to write data and requires data writing multiple times.

What is claimed is:

1. A testing apparatus for testing a memory IC having a redundancy circuit, comprising:

first memory means having a memory area for row addresses of a target memory, for storing row addresses of defective bits of the target memory;

counter means for counting a number of defective-bit containing rows of the target memory;

second memory means for storing a number of rows of spare memory cells provided in the redundance circuit; and first comparator means for comparing a count value of said counter means with a number of rows stored in said second memory means, wherein when the count value of said counter means exceeds the number of rows of spare memory cells stored in said second memory means, a test is terminated because the target memory is judged as unrepairable, and when the count value does not exceed the number of rows of spare memory cells stored in said second memory means, memory cells in a defective-bit containing row in the target memory are replaced with memory cells in an associated row in the redundancy circuit based on the row addresses stored in said first memory means.

2. A testing apparatus according to claim 1, further comprising:

pattern generator means for generating and supplying address signal and data for test to the target memory, said pattern generator means being disabled when said first comparator means outputs a signal representing an unrepairable state;

second comparator means for comparing data read out from the target memory with the data from said pattern generator means; and control means for receiving an output of said second comparator means and the address signal from said pattern generator means, and performing control to write row addresses of defective bits in said first memory means when the data read out from the target memory differs from said data from said pattern generator means.

3. A testing apparatus according to claim 1, further comprising third memory means having a memory area for row addresses of the target memory, for storing presence of defective bits in the target memory, said counter means being counted up when defect information is written in said third memory means.

4. A testing apparatus for testing a memory IC having a redundancy circuit, comprising:

first memory means having a memory area for row addresses of a target memory, for storing row addresses of defective bits of the target memory;

second memory means having a memory area for column addresses of the target memory, for storing column addresses of defective bits of the target memory;

first counter means for counting a number of defective-bit containing rows of the target memory;

second counter means for counting a number of defective-bit containing columns of the target memory;

third memory means for storing a number of rows of spare memory cells provided in the redundancy circuit;

fourth memory means for storing a number of columns of spare memory cells provided in the redundance circuit;

first comparator means for comparing a count value of said first counter means with a number of rows stored in said third memory means;

second comparator means for comparing a count value of said second counter means with a number of columns stored in said fourth memory means; and logical product means for acquiring a logical product of comparison outputs of said first and second comparator means and outputting a repair enable signal representing a repairable state, wherein when the repair enable signal is output, memory cells in at least one of a defective-bit containing row and a defective-bit containing column in the target memory are replaced with memory cells in at least one of an associated row and an associated column in the redundance circuit based on the row addresses of defective bits stored in said first memory means and the column addresses of defective bits stored in said second memory means.

5. A testing apparatus according to claim 4, further comprising:

pattern generator means for generating and supplying an address signal and data for test to the target memory;

third comparator means for comparing data read out from the target memory with the data from said pattern generator means; and control means for receiving an output of said third comparator means and the address signal from said pattern generator means, and performing control to write row addresses of defective bits in said first memory means and write column addresses of defective bits in said second memory means when the data read out from the target memory differs from the data from said pattern generator means.

6. A testing apparatus according to claim 4, further comprising:

fifth memory means having a memory area for row addresses of the target memory, for storing presence of defective-bit containing rows in the target memory; and sixth memory means having a memory area for column addresses of the target memory, for storing presence of defective-bit containing columns in the target memory, said first counter means being counted up when defect information is written in said fifth memory means, and said second counter means being counted up when defect information is written in said sixth memory means.

7. A testing apparatus for a memory IC with a redundancy circuit, comprising:

first memory means for address failure, having at least a same memory area as a target memory, for storing defect information;

first counter means for counting a number of defective-bit rows based on said defect information stored in said first memory means;

second counter means for counting a number of defective-bit columns based on the defect information stored in said first memory means;

second memory means for storing row addresses of defective bits of the target memory, with a number of defective bits present in the same row being taken as an address; and third memory means for storing column addresses of defective bits of the target memory, with a number of defective bits present in the same column being taken as an address, wherein memory cells in at least one of a defective-bit containing row and a defective-bit containing column in the target memory are replaced with memory cells in at least one of an associated row and an associated column in the redundancy circuit based on the row addresses of defective bits stored in said second memory means and the column addresses of defective bits stored in said third memory means.

8. A testing apparatus according to claim 7, further comprising:
pattern generator means for generating and supplying address signal and data for test to the target memory;
comparator means for comparing data read out from the target memory with the data from said pattern generator means; and
control means for receiving an output of said comparator means and the address signal from said pattern generator means, and performing control to write row addresses of defective bits in said second memory means and write column addresses of defective bits in said third memory means when the data read out from the target memory differs from the data from said pattern generator means.

9. A testing apparatus according to claim 8, further comprising:
first selector means for writing fail row addresses as data into said second memory means, with a number of defective bits being taken as an address, under control of said control means; and
second selector means for writing fail column addresses as data into said third memory means, with a number of defective bits being taken as an address, under control of said control means.

10. A testing apparatus for testing a memory IC having a redundance circuit, comprising:
a first testing section and a second testing section, said first testing section including,
first memory means having a memory area for row addresses of a target memory, the first memory means storing row addresses of defective bits of the target memory,
second memory means having a memory area for column addresses of the target memory, for storing column addresses of defective bits of the target memory,
first counter means for counting a number of defective-bit containing rows of the target memory,
second counter means for counting a number of defective-bit containing columns of the target memory,
third memory means for storing a number of rows of spare memory cells provided in the redundance circuit,
fourth memory means for storing a number of columns of spare memory cells provided in the redundance circuit,
first comparator means for comparing a count value of said first counter means with a number of rows stored in said third memory means,
second comparator means for comparing a count value of said second counter means with a number of columns stored in said fourth memory means, and
logical product means for acquiring a logical product of comparison outputs of said first and second comparator means and outputting a repair enable signal representing a repairable state,
said second testing section including,
fifth memory means for address failure, having at least a same memory area as the target memory, for storing defect information,
third counter means for counting a number of defective-bit rows based on the defect information stored in said fifth memory means,
fourth counter means for counting a number of defective-bit columns based on said defect information stored in said fifth memory means,
sixth memory means for storing row addresses of defective bits of the target memory, with a number of defective bits present in the same row being taken as an address, and
seventh memory means for storing column addresses of defective bits of the target memory, with a number of defective bits present in the same column being taken as an address,
wherein when the repair enable signal is output from said logical product means in said first testing section and memory cells in at least one of a defective-bit containing row and a defective-bit containing column in the target memory can be replaced with spare memory cells in at least one of an associated row and an associated column in the redundancy circuit, memory cells in the defective-bit containing at least one of row and column in the target memory are replaced with memory cells in at least one of the associated row and associated column in the redundance circuit, based on the row addresses of defective bits stored in said first memory means and the column addresses of defective bits stored in said second memory means, and when defective memory cells in the target memory can be replaced with spare memory cells both in an associated row and an associated column in the redundance circuit, the defective memory cells both in a defective-bit containing row and a defective-bit containing column in the target memory are replaced with the spare memory cells in the redundance circuit, based on the row addresses of defective bits stored in said sixth memory means and the column addresses of defective bits stored in said seventh memory means in said second testing section.

11. A testing apparatus according to claim 10, further comprising:
pattern generator means for generating and supplying an address signal and data for test to the target memory;
third comparator means for comparing data read out from the target memory with said data from said pattern generator means; and
control means for receiving an output of said third comparator means and the address signal from said pattern generator means, and performing control to write data to said first memory means, said second memory means, said sixth memory means and said seventh memory means when the data read out from the target memory differs from the data from said pattern generator means.

12. A testing apparatus for testing a memory IC having a redundance circuit, comprising:
first memory means having a memory area for column addresses of a target memory for storing column addresses of defective bits of the target memory;
counter means for counting a number of defective-bit containing columns of the target memory;
second memory means for storing a number of columns of spare memory cells provided in the redundance circuit; and
first comparator means for comparing a count value of said counter means with a number of columns stored in said second memory means, wherein when the count value of said counter means exceeds the number of columns of spare memory cells stored in said second memory means, a test is terminated because the target memory is judged as unrepairable when the count value does not exceed the number of columns of spare memory cells stored in said second memory means, memory cells in a defective-bit containing column in the target memory are replaced with memory cells in an associated column in the redundance circuit based on the column addresses stored in said first memory means.

13. A testing apparatus according to claim 12, further comprising:

pattern generator means for generating and supplying an address signal and data for test to the target memory, said pattern generator means being disabled when said first comparator means outputs a signal representing an unrepairable state;

second comparator means for comparing data read out from the target memory with the data from said pattern generator means; and control means for receiving an output of said second comparator means and the address signal from said pattern generator means, and performing control to write column addresses of defective bits in said first memory means when the data read out from the target memory differs from said data from said pattern generator means.

14. A testing apparatus according to claim 12, further comprising third memory means having a memory area for column addresses of the target memory, for storing presence of defective bits in the target memory, said counter means being counted up when defect information is written in said third memory means.

* * * * *